United States Patent [19]

Lewis

[11] 4,247,835

[45] Jan. 27, 1981

[54] SURFACE ACOUSTIC WAVE DEVICES

[75] Inventor: Meiron F. Lewis, Malvern, England

[73] Assignee: The Secretary of State for Defence in Her Britannic Majesty's Government of the United Kingdom of Great Britain and Northern Ireland, London, England

[21] Appl. No.: 41,852

[22] Filed: May 24, 1979

[30] Foreign Application Priority Data

May 24, 1978 [GB] United Kingdom ............... 22075/78

[51] Int. Cl.³ .................. H03H 9/25; H03H 9/42; H01L 41/18
[52] U.S. Cl. .................. 333/155; 310/313 R; 333/195
[58] Field of Search .................. 333/150–155, 333/193–196; 252/62.9; 310/313, 357, 361, 362; 29/25.35, 594

[56] References Cited

U.S. PATENT DOCUMENTS 3,818,382  6/1974  Holland et al. .................. 310/313
3,995,240  11/1976  Kerbel .................. 310/313

FOREIGN PATENT DOCUMENTS 1378578  12/1974  United Kingdom .

OTHER PUBLICATIONS

Schulz et al.–"Temperature Dependence of Surface Acoustic Wave Velocity on a Quartz", Journal of Applied Physics, Jun. 1970, pp. 2755–2765.

Primary Examiner—Marvin L. Nussbaum
Attorney, Agent, or Firm—Pollock, Vande Sande and Priddy

[57] ABSTRACT

A surface acoustic wave device comprises a quartz substrate having a flat surface carrying one or more transducers for launching and receiving surface acoustic waves along a track in the flat surface. In this invention the flat surface lies in a plane rotated about a Y axis by plus or minus 41° to 47° from the Z plane and the track is aligned 61° to 67° from the Y axis.

5 Claims, 4 Drawing Figures

SURFACE ACOUSTIC WAVE DEVICES

This invention relates to surface acoustic wave (SAW) devices.

Such devices commonly comprise a piezoelectric, e.g. quartz, substrate carrying an input and an output interdigital comb transducer on a flat surface. Electrical signals are converted by the input transducer into surface acoustic waves which travel along a track towards the output transducer where the surface waves are converted back into electrical signals. The device may be used as filters, delay lines, or as the feedback element in oscillators etc., by suitable arrangement of transducer length and shape, and length of acoustic wave track. Use of SAW devices in oscillators is described in "Ultrasonics", May 1974, pages 115 to 123.

Another form of SAW device, termed a single port resonator, employs a single transducer, for the dual purpose of input and output transducer, arranged between two reflecting arrays of metal strips or grooves.

With all acoustic wave devices it is necessary to cut and polish the quartz precisely and to align the transducers precisely so that the substrate orientation and acoustic propagation direction are defined relative to the crystal axes.

Prior art surface acoustic wave devices using quartz usually employ the so-called ST plane (with propagation parallel to the x-axis) so that the effects of temperature change (e.g. variation of frequency and delay with temperature) are minimized.

According to this invention a surface acoustic wave device comprises a quartz substrate having a flat surface which carries an input and output transducer means for launching and receiving acoustic waves along a track in or on the flat surface, wherein the flat surface is in a plane rotated about the Y axis by plus or minus 41° to 47° from the Z plane and the track is aligned 61° to 67° from the Y axis, the sense of the 61°–67° alignment being such that the track is approximately perpendicular to a minor rhombohedral face of the crystal.

The input and output transducer means may be a single transducer, as in a one-port resonator, or a separate input transducer and an output transducer as in a delay line or two-port resonator. More than two transducers may be used, together with reflecting array structures, or couplers as in U.K. Pat. Ser. No. 1,372,235.

The invention will now be described by way of example only with reference to the accompanying drawings in which.

Figure 1:
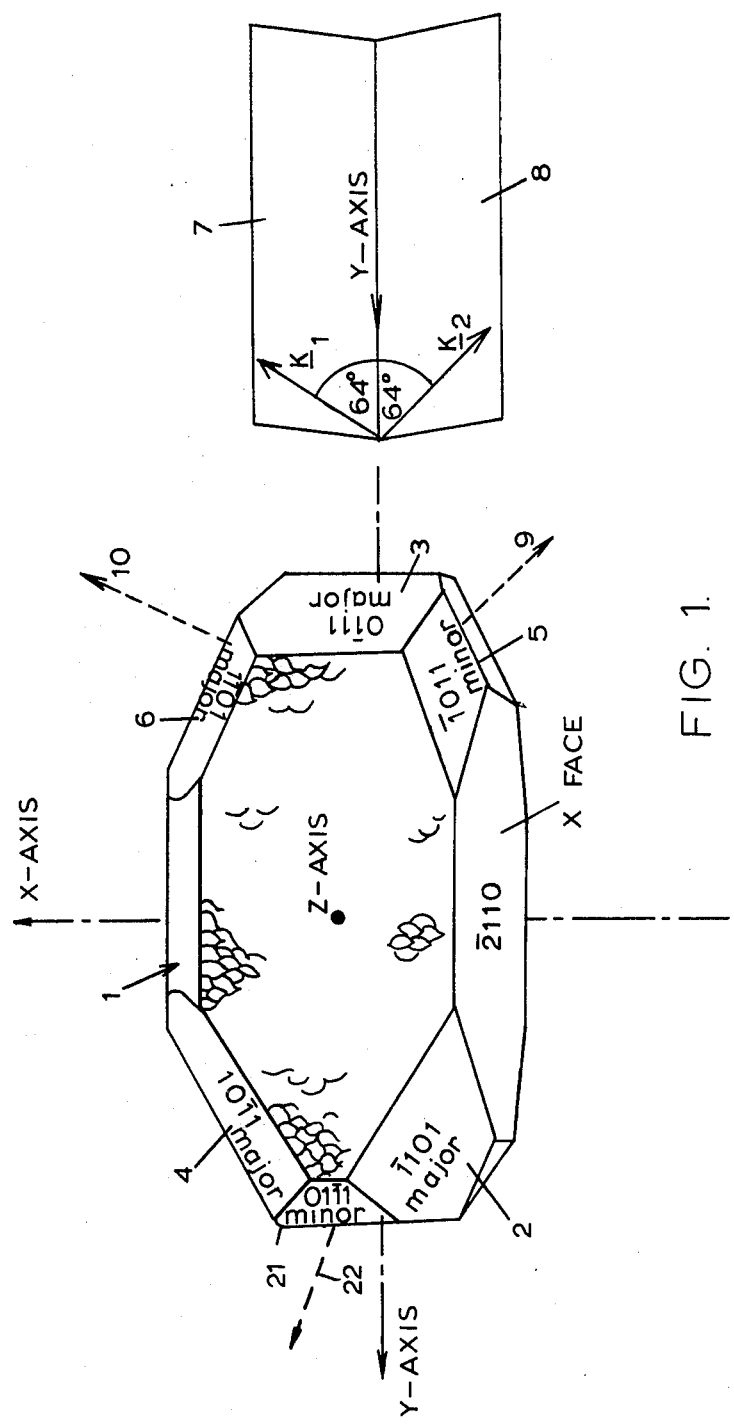
FIG. 1 shows a quartz crystal with various crystalline planes to define axes.

As shown in FIG. 1 a crystal 1 has axes X, and Y, Z, major rhombohedral faces 2, 3, 4 indicated conventionally by $1\bar{1}01$, $0\bar{1}11$, $10\bar{1}1$. Three minor rhombohedral faces 5, 6, 21 can be seen referenced $\bar{1}011$, $1\bar{1}01$, $01\bar{1}1$. An X plane is referenced $2\bar{1}\bar{1}0$ and is (by definition) a plane normal to the X axis.

Adjacent the crystal are two planes 7, 8 rotated about the Y axis by + and −46° from the X plane, i.e. rotated by − and +44° from a Z (or XY) plane (an XY plane being a plane containing the X and Y axis). Lying on these planes 7, 8 are the vectors $k_1$, $k_2$ of the acoustic propagation. These vectors are at 64° to the Y axis and are almost normal to the two minor rhombohedral faces $1\bar{1}01$ and $\bar{1}011$ whose normals are indicated by dotted lines 9, 10.

As described above the quartz cuts are related to one particular set of XYZ axes. However since quartz is trigonal it has three equivalent X, Y axes, the Z axis being unique. The cuts described above can be obtained from appropriate +46° rotation about any of the three sets of Y axis. In some cases this will involve propagation normal to the third minor rhombohedral face $01\bar{1}1$ i.e. a k approximately parallel to the normal 22 from this face.

Figure 2:
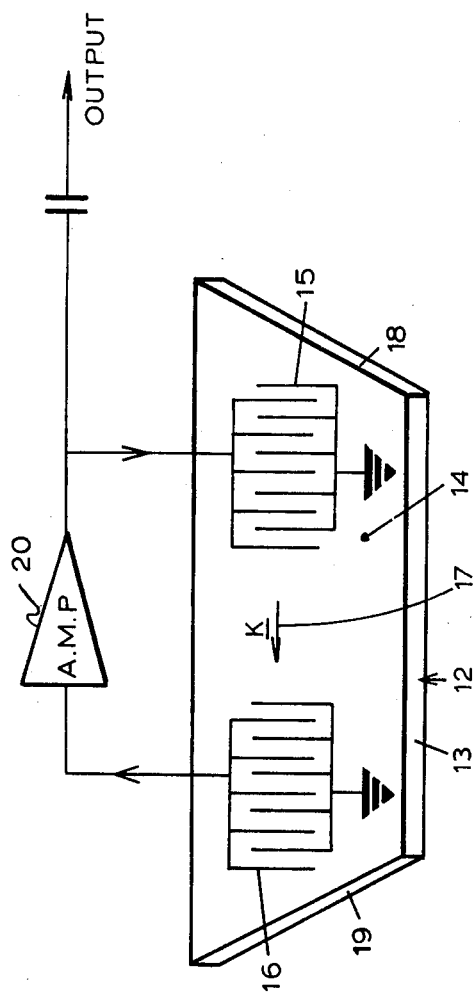
FIG. 2 shows a surface acoustic wave delay line device.

The device 12 of FIG. 2 comprises a substrate of quartz having a flat surface 14 cut and polished to lie in one of the planes defined above. On the surface 14 are two interdigital transducers 15, 16 spaced along a track ($k_1$ or $k_2$) 17 aligned as defined above. The transducer length, number of finger pairs and intertransducer spacing is selected to provide the desired device response e.g. a single moded oscillator as described in U.K. Pat. Ser. No. 1,451,326. Surface wave reflections are reduced by angling the ends 18, 19 of the substrate. Connecting the transducers to an amplifier 20 provides a feedback loop with characteristics determined predominantly by the delay line device 12. The roles of input transducer 15 and output transducer 16 are reversible. The invention is not limited to oscillators but may be used for all SAW devices where temperature stability is required.

Figure 3:
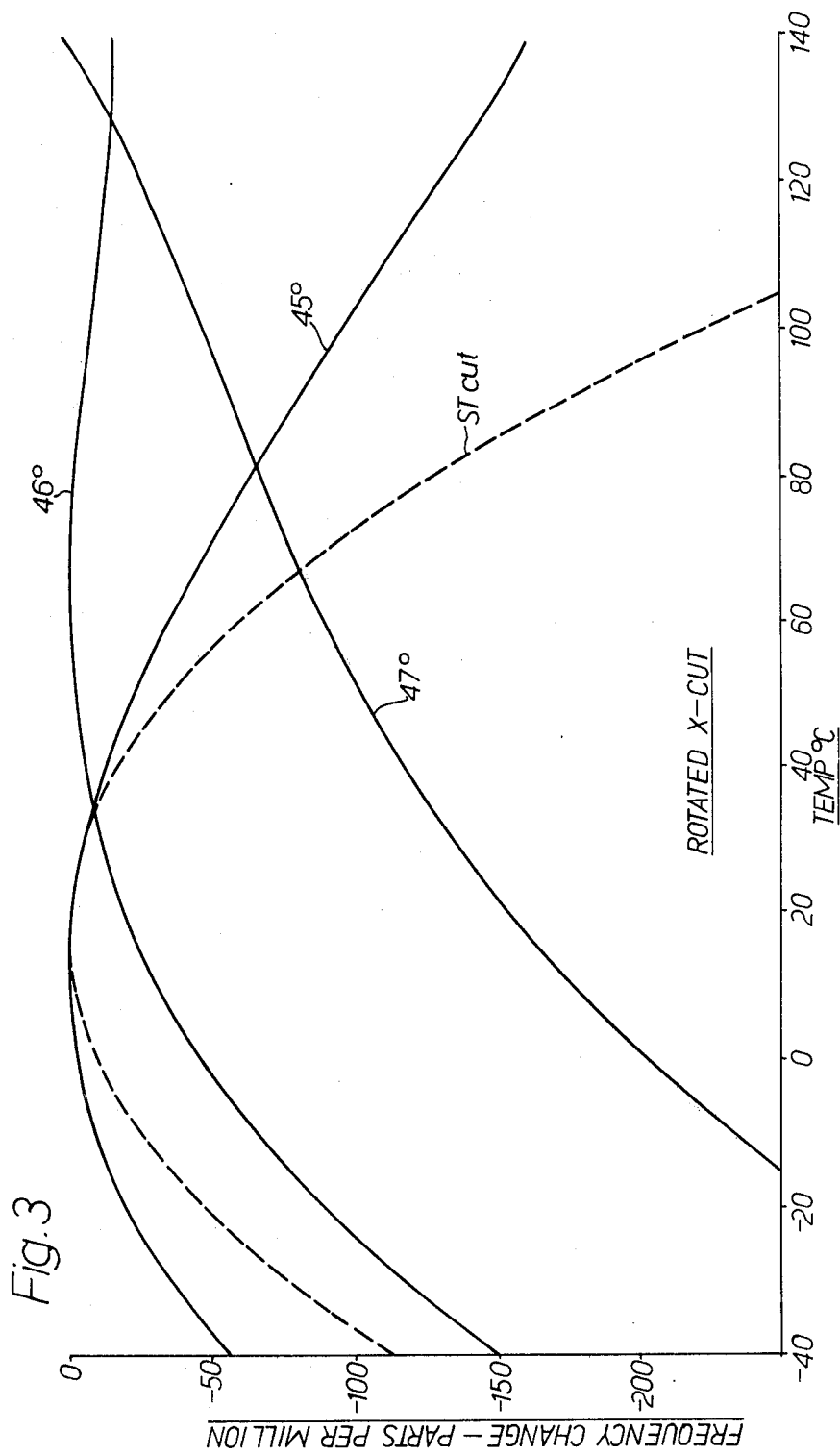
FIG. 3 shows temperature/frequency curves for a range of surface alignments.

FIG. 3 shows how the frequency of an oscillator such as in FIG. 2 changes with device temperature for a series of different crystal cuts, the cuts being 45°, 46°, and 47° rotated X cut with propagation at 64° to the Y axis (i.e. $k_1$ or $k_2$ above). A 44° cut (and the lower angles of cut) have zero temperature coefficients at lower temperature values. Also shown in broken lines, for comparison, is a graph for an ST cut quartz device.

For devices detailed above the SAW velocity is about 3317 meters/second. Beam steering (SAW track deviation) is less than $\frac{1}{2}°$ providing the k vector is not varied much, preferably by less than 1°, from the 64° value. The beam steering is not very sensitive to variation of the flat surface alignment so that alignment can be varied to select the desired characteristic as shown in FIG. 3. The presence of heavily metalized transducers affects the values of FIG. 3, since these results are for essentially free surfaces, but known techniques may be used to determine corrections.

Ageing of devices may also show an improvement with cuts as described above since surface contamination appears to have less effect than on ST-cut quartz.

Figure 4:
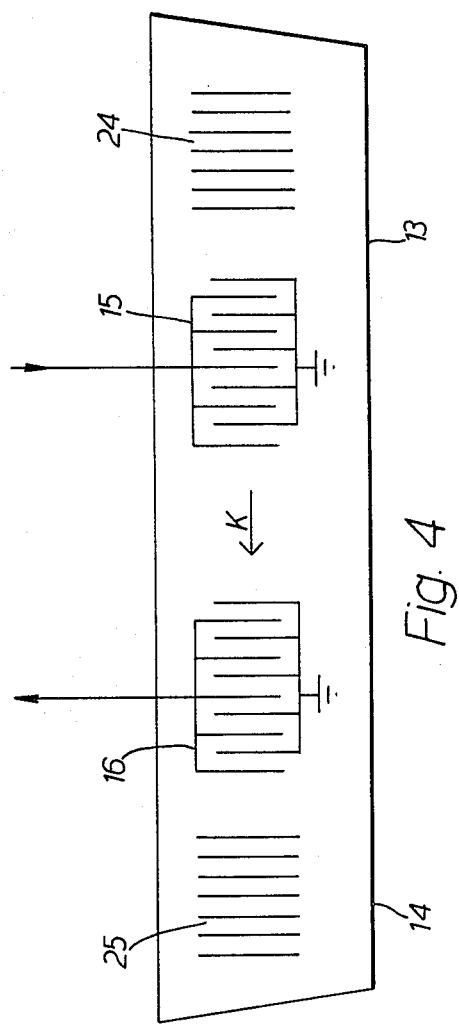
FIG. 4 shows a two port surface acoustic wave resonator.

FIG. 4 shows a two port resonator which is similar to the delay line of FIG. 2 with the addition of two arrays 24, 25 of reflecting strips. This results in a higher Q device than a delay line. Resonators are described by F. G. Marshall in Proc. of the 1975 I.E.E.E. Ultrasonics Symposium I.E.E.E. Cat. 75 CH(994-4SU page 290.

An acoustic wave device for improving the temperature stability has been described by T. I. Browning and M. F. Lewis in 1978 Ultra Sonics Symposium Proc. I.E.E.E. Cat. 78 CH 1344 1 SU. This uses two or more acoustic tracks, on a single substrate, connected electrically in parallel. The main track is aligned in a direction having an inherently good temperature stability e.g. as described above while the subsidiary track(s) are aligned to provide different temperature co-efficients.

I claim:

1. A surface acoustic wave device comprising a quartz substrate having a flat surface, and transducer means for launching and receiving acoustic waves along a track in the flat surface wherein the improvement comprises a flat surface which is in a crystalline plane rotated about a Y axis by a value in the range, plus 41° to 47° inclusive and minus 41° to 47° inclusive from the Z plane, and the track is aligned in the range 61° to 67° inclusive from the Y axis, the sense of this alignment being such that the track is approximately perpendicular to a minor rhombohedral crystalline face of the quartz substrate.

2. A device according to claim 1 wherein the range is 44° to 47° inclusive.

3. A device according to claim 1 wherein the alignment is in the range 63° to 65° inclusive.

4. A device according to claim 1 wherein the transducer means comprises at least two interdigital comb transducers spaced apart along the track.

5. A device according to claim 1 and further comprising reflecting arrays at both ends of the track.

* * * * *